Figure 1:
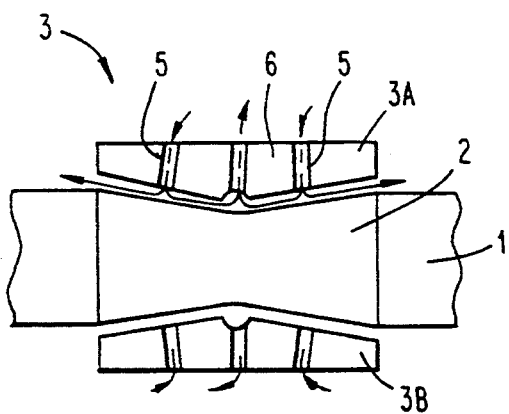

United States Patent [19]
Tyrén

[11] Patent Number: 5,382,863
[45] Date of Patent: Jan. 17, 1995

[54] METHOD AND DEVICE IN A MOTOR

[75] Inventor: Carl Tyrén, Antibes, France

[73] Assignee: DSP Holdings Ltd., Nicosia, Cyprus

[21] Appl. No.: 84,252

[22] PCT Filed: Dec. 27, 1991

[86] PCT No.: PCT/SE91/00916
§ 371 Date: Jul. 7, 1993
§ 102(e) Date: Jul. 7, 1993

[87] PCT Pub. No.: WO92/12569
PCT Pub. Date: Jul. 23, 1992

[30] Foreign Application Priority Data
Jan. 7, 1991 [SE] Sweden .............. 9100034-9

[51] Int. Cl.⁶ ..................................... H01L 41/08
[52] U.S. Cl. ........................... 310/328; 310/323; 310/26
[58] Field of Search ............ 310/311, 323, 328, 26

[56] References Cited

U.S. PATENT DOCUMENTS

| | | | |
|---|---|---|---|
| 3,389,274 | 6/1968 | Robertson | 310/26 |
| 3,649,856 | 3/1972 | O'Neill | 310/328 |
| 4,454,441 | 6/1984 | Taniguchi | 310/328 |

FOREIGN PATENT DOCUMENTS

| | | |
|---|---|---|
| 1498635 | 1/1978 | United Kingdom . |
| WO8805618 | 7/1988 | WIPO . |
| WO9007821 | 7/1990 | WIPO . |

*Primary Examiner*—Mark O. Budd
*Attorney, Agent, or Firm*—Lowe, Price, LeBlanc & Becker

[57] ABSTRACT

The invention relates to a method and a device for causing a first body (3, 7, 14), which is held in engagement with a second body (1, 8, 12), to move along said body, said second body comprising material which may be caused to undergo a dimensional change across the intended direction of movement due to magnetostrictive, electrostrictive or piezoelectrical action. Said first body (3, 7, 14) is continuously held in cooperation through form engagement with a zone (2, 10A, 10B, 15) on said second body, which is caused to undergo a dimensional change across the intended direction of movement under the influence of a magnetic field or an electrical field said zone (2, 10A, 10B, 15) by displacement of said magnetic or electric field in the intended direction of movement being displaced in said direction during simultaneous driving action on said first body (3, 7, 14) through form engagement for coupled movement together with said zone (2, 10A, 10B, 15).

12 Claims, 3 Drawing Sheets

METHOD AND DEVICE IN A MOTOR

The present invention relates to a method and a device for causing a first body, which is held in engagement with a second body, to move therealong, said second body being composed of or consisting of materials which due to magnetostrictive, electrostrictive or piezoelectrical action may be caused to undergo a dimensional change across the intended movement direction.

It is previously known to use the material deformations obtained in materials of the kind mentioned initially under the influence of a magnetic or an electric field, in order to bring about a movement of a mechanical element, e.g. in electrical contact means, in printers or in step motors, adjusting motors etc. For use in motors it has proved to be advantageous to use magnetostrictive materials, and particularly so called giant magnetostrictive materials, i.g. materials consisting of an alloy between rare earth metals and magnetic transition metals. The largest magnetostriction known so far has been established within this group of alloys, i.g. the property of undergoing, under the influence of a magnetic field, a dimensional change corresponding to the magnitude of the magnetic field. All those motor constructions are characteristic in that the material deformation generated by magnetic or electric influence in a repeated manner is transformed into an outer mechanical movement. This generally results in motor constructions with a relatively low movement velocity, linear or rotating.

A motor construction of this kind which per se is excellent is described in the international publications WO 88/05618 and WO 90/07821. In one embodiment described in one of said applications, a giant magnetostrictive rod (Terfenol rod) is by shrinking fixed within a tube. By actuating a partial zone of the rod from one end thereof to the other under the influence of a magnetic field which is movable along said rod, the giant magnetostrictive rod is caused to move stepwise along the tube. The step dimension corresponds to the axial elongation caused within the actuated zone. A typical dimension of this elongation is about 10 μm. Each of said steps requires a zone displacement along the entire length of the giant magnetostrictive rod. The zone displacement can take place with a very high velocity and is in principle limited by the elastic wave velocity of the material, which for the giant magnetostrictive material which is called Terfenol amounts to about 1700 m/s. Since each step requires a zone displacement along the entire length of the rod, the resulting movement velocity of the motor is substantially lower than the movement velocity of said zone.

The object of the present invention is to provide a method and a device in which materials of the kind mentioned initially are used to cause a first body, which is held in engagement with a second body of said material, to move along said body, and thereby bring about a motor allowing very fast and at the same time exact movements, linear or rotating, and which has high velocity and acceleration performances and renders possible a good positional control and rigid and exact position adjustment characteristics.

The object mentioned above is obtained by giving the method and the device according to the invention the characteristic features specified in the appended claims.

Figure 3:
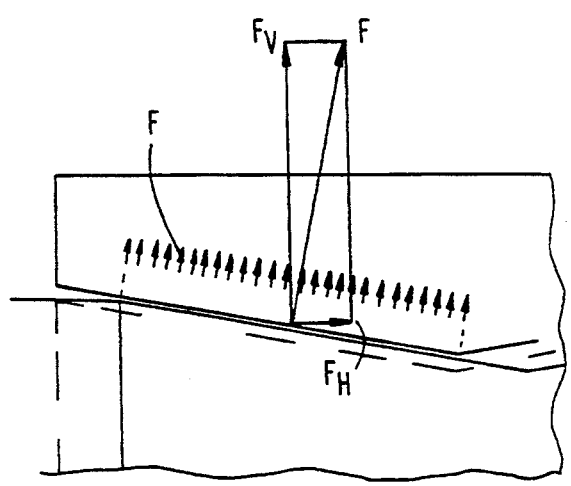
Figure 2:
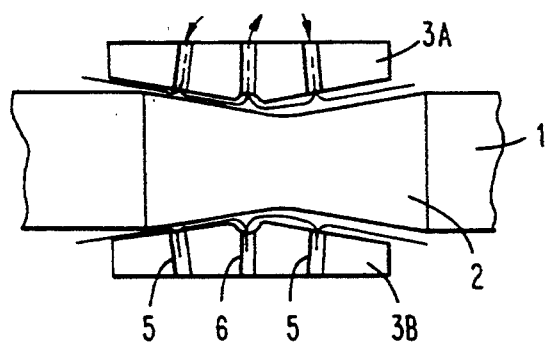
Figure 4:
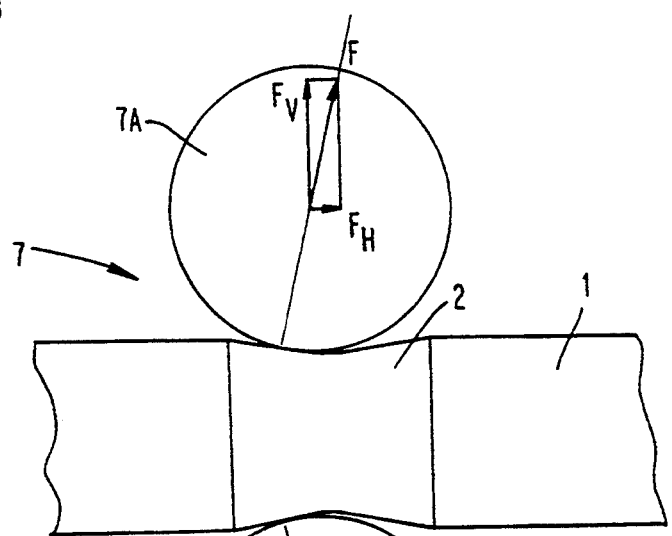
Figure 5:
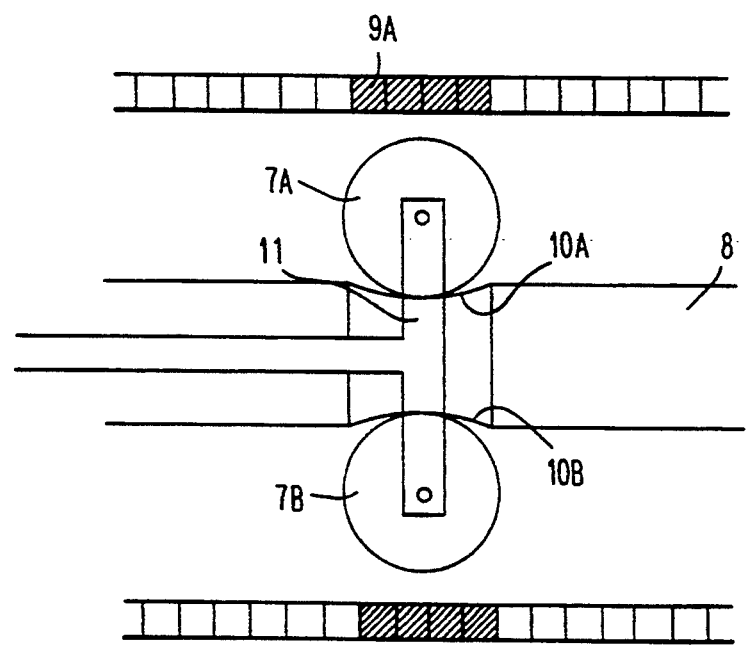
Figure 6:
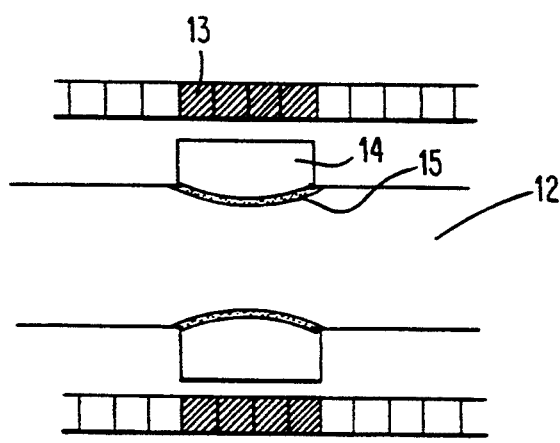
Figure 7:
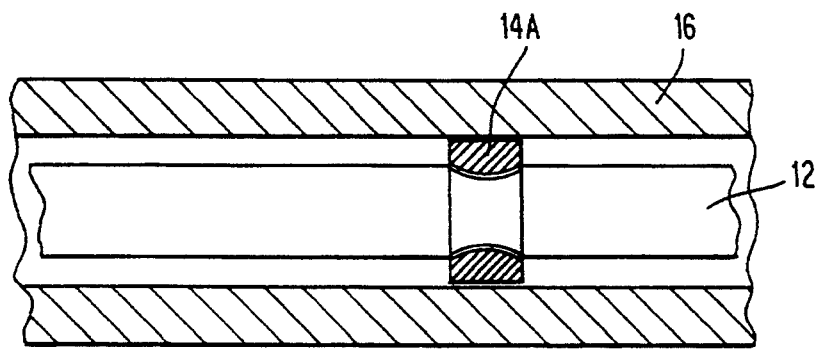
Figure 8:
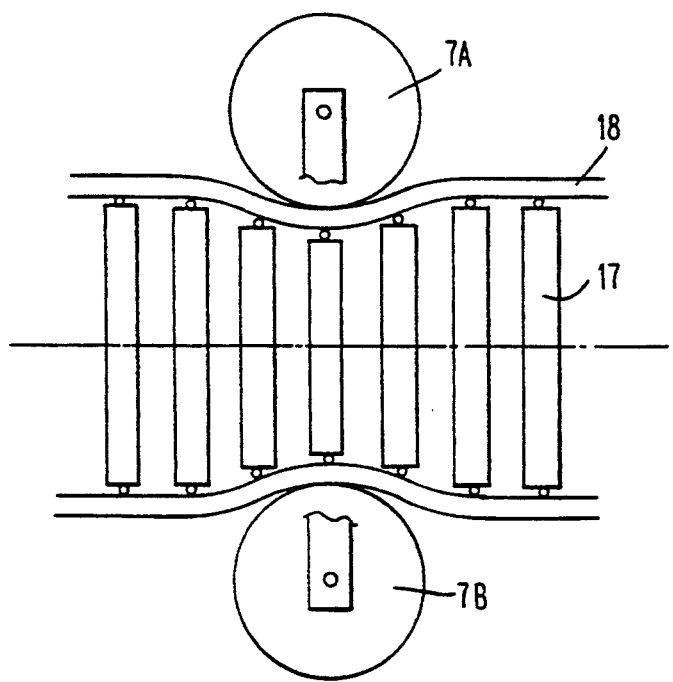

The invention is described below with reference to schematical examples of embodiments illustrated in the appended drawings, in which FIG. 1 and 2 schematically illustrate the principal mechanical construction of a motor variant according to the invention with a sliding movement between the fixed and the movable part of fluid motor, FIG. 3 schematically illustrates the power transmission between the movable and the fixed part of the motor according to FIGS. 1 and 2, FIG. 4 schematically illustrates a motor variant according to the invention, with rolling movement between the fixed and the movable part of said motor, FIG. 5 schematically shows an embodiment including a plane rod of magnetostrictive material cooperating with a pair of interconnected rolls, FIG. 6 schematically shows an embodiment with a magnetostrictive rod having a circular cross section which cooperates with an annular body, FIG. 7 schematically illustrates a variant of the motor shown in FIG. 6, end FIG. 8 schematically illustrates a further variant the embodiment according to the invention.

FIGS. 1-3 are very schematic figures intended to illustrate the pricipal construction of a variant of the motor according to the invention, in which a sliding movement is imposed to a body which is movable along an elongated rigid body. The rigid body 1 consists of an elongated rod having upper and lower plane parallel sides. The elongated body is made of a magnetostrictive, electrostrictive or a piezoelectrical material. Under the influence of a magnetic or an electric field, not shown, a zone 2 of the rod 1 is caused to undergo a contraction in the transversal direction of said rod. By moving the magnetic or the electrical field along the rod the deformed zone 2 may be caused to move along the rod 1 in the form of a contraction wave propagating in the longitudinal direction of said rod. In FIGS. 1-3 the deformation zone has been illustrated as a V-shaped deformation zone. In reality the deformation zone 2 probably is not v-shaped but will form a bow shaped recess on the upper and lower sides respectively of the rod 1. The V-shape in FIGS. 1-3 have been chosen in order to facilitate the understanding of the power transmission between the movable part and the fixed part of the motor.

In accordance with the invention a body 3 which is movable along the rod 1 is arranged for cooperation due to form engagement with the deformed zone 2 of the rod 1. The body 3 consists of an upper part 3A and a lower part 3B, which are interconnected and are held pressed against the rod 1 in the deformed zone 2 via an intermediate lubricant film 4 between the contact surfaces. There is thus no direct mechanical contact between the surfaces. The lubricant 4 is supplied through lubrication channels 5 in the body 3, said body also comprising return channels 6 for said lubricant. The surface of the upper part 3A and the lower part 3B, respectively, of the body 3 which faces the deformed zone 2, is shaped with a configuration which as close as possible corresponds to the shape of the deformation zone of the rod 1. However, in FIGS. 1-3 said form is illustrated as a V-shaped surface. The lubricant 4 is supplied with such a pressure and such a flow, that a thin lubricating film continuously is maintained between the contact surfaces.

FIG. 2 illustrates an initiated displacement of the deformation zone 2 along the rod 1 in a direction to the right in the figure. In the initial phase of the movement of zone 2 in the longitudinal direction of rod 1, a certain compression of the lubricant film 4 is obtained, so that stable pressure conditions are established in the lubricant film. The sloping surface of the upper respective the lower part 3A, 3B of the body 3, as seen to the left in the figures, is then actuated via the lubricant film 4 by a distributed load. This condition is most clearly illustrated in FIG. 3. The distributed load f has in FIG. 3 been marked as an evenly distributed load. In reality the distributed load f probably is variable along the surface. This distributed load f is composed into a resulting force F acting on the upper and the lower part 3A, 3B respectively of the body 3. The force F acts perpendicularly towards the engagement surface between the body 3 and the deformation zone 2 of the rod 1. The force P has a vertical component $F_V$ and a horizontal component $F_H$. The force component $F_H$ thus acts in parallel with the axial direction of the body 1 and causes the body 3 to move along the body 1. A prerequisite of this is, however, that the lubricant film 4 is continuously maintained, for instance by hydrostatically journalling the body 2 on the body 1. The lubricant to be used should have a low viscosity. Conceivable lubricants are e.g. a thin lubricant oil, water or pressure air.

If, in the principal exemple according to FIGS. 1-3, the body 1 instead consists of a rod having a circular cross section, the body 3 forms a ring, and the deformation zone, instead of having V-shape has a double conical shape, composed of two frustums of a cone.

The body 3 is thus caused to move along the elongated body 1 together with the deformation zone 2 propagating along the rod. This results in that the body 3 can obtain very rapid and at the same time exact movement.

FIG. 4 schematically illustrates a principal variant of an embodiment according to the invention, in which no lubrication of the contact surfaces between the movable and the fixed part of the motor i required. This motor variant also comprises an elongated rod 1 of a magnetostrictive, electrostrictive or a piezoelectrical material. The rod 1 has upper and lower plane parallel sides. In this figure as well as in FIGS. 1-3, the deformation zone 2 has been indicated as two straight planes sloping towards each other. The body 7 which is movable along the body 1 consists, in this principal embodiment, of an upper roller 7A and a lower roller 7B which are connected to each other and are held pressed against the sloping surfaces of the deformation zone 2 by means, not shown. When the deformation zone 2 is caused to move to the right in the figure, the sloping surfaces thereof will act on the periferal surfaces of the rolls 7A and 7B with a force F, which is directed perpendicularly towards said sloping surfaces and extending through the rotational center of the respective roller. The roller 7A, 7B are thus each influenced by a force F having a vertical component $F_V$ and a horizontal component $F_H$. Under the influence of the horizontal force components $F_H$, the rollers are caused to preform a rolling movement in parallel with the movement direction of the movable deformation zone 2. No lubrication of the contact surfaces between the rollers and the deformation zone is required. The body 7 is thus caused to move by rolling movement along the rod 1 as the deformation zone 2 moves along the rod.

FIGS. 5-7 schematically illustrate some embodiments, in which the rod or the body along which the movable body shall be displaced, consists of a gland magnetostrictire material, e.g. Terfenol.

The motor illustrated in FIG. 5 thus comprises an elongated rod 8 of a giant magnetostrictive material. Rod 8 has plane parallel upper and lower sides. Above respectively underneath the rod 8 a series of magnetic coals 9A and 9B respectively are disposed for generating a magnetic field resulting in curved deformation zones 10A, 10B of said rod 8. By controlling the magnetic coils 9A one after the other as well as the magnetic coils 9B one after the other, the deformation zones 10A, 10B are caused to move like a deformation wave along the rod 8. The arrangement of the magnetic coils 9A, 9B and the control of the switching in of the magnetic coils are suitably carried out in a manner corresponding to the manner described in the publication WO 90/07821 mentioned previously.

The body which shall be displaced along the rod, in this case consists of an upper roller 7A and a lower roller 7B, which are interconnected by means of rigid frame elements 11, fixing the rollers 7A and 7B at a constant distance from each other. The distance is adjusted so that the periferal surface of the rollers are in contact with the upper surfaces of the deformed zones 10A and 10B. This means that the rollers must be positioned on the body 8 with a certain preload. Alternatively the rollers 7A, 7B may be interconnected by means of a resilient element which constantly keeps the rollers 7A, 7B pressed against the upper and lower surface respectively of the rod 8. The frame element 11 is suitably provided with guide elements, not shown, e.g. guide rollers, for guiding the frame 11 so that the axes of the rollers 7A and 7B constantly are maintained in a plane perpendicular to the rod 8.

By suitable control of the engagement of the magnetic coils 9A, 9B, the deformation zones 10A, 10B and thus the rollers 7A, 7B are caused to move along the rod 8 in the desired direction with a great velocity and high precision.

FIG. 6 illustrates an embodiment comprising a rigid rod 12 of a giant magnetostrictive material, e.g. Terfenol. The rod 12 has a circular cross section and is surrounded by magnetic coils 13 disposed adjacent each other and arranged in a connecting and control arrangement designed in accordance with the technique known from the publication WO 90/07821. A ring 14 is disposed by shrinking on the rod 12, said ring having a width corresponding to the length of the deformed zone 15 and having an internal shape and internal dimensions corresponding to shape and dimensions of the deformated zone 15. A lubricating film is arranged in the manner mentioned previously, in the contact surfaces between the ring 14 and the deformation zone 15, so that said surfaces are not in direct metallic contact with each other.

By controlling the engagement of the magnetic coils 13 in a manner known per se, the deformation zone 15 is thus caused to move axially in the desired direction along the rod 12. By the form dependent engagement between the ring 14 and the deformation zone 15, the ring 14 is then caused to move along with the deformation zone in the desired movement direction.

FIG. 7 illustrates a variant of the embodiment shown in FIG. 6. The rod 12 of giant magnetostrictive material, e.g. Terfenol, supports an annular body 14A, adapted to a deformation zone 15 of the body 1. As mentioned previously it is made sure that a lubrication film is continuously maintained in the contact surfaces between the annular body 14 and the deformation zone 15. In order to reduce the mass of the annular body 14A at the same time as its radial stiffness is secured, the rod 12 and the annular body 14A are surrounded by a outer tube element 16 being arranged coaxially and having a high radial stiffness. In this embodiment a suitable lubricant is also supplied between the outer periferal surface of the annular body and the inner surface of the tube 16, so that a lubricant film is continuously maintained and so that the axial movement of the annular body 14A is not prevented. By this arrangement a slidable radial support of the annular body 14A is obtained, by means of which the diameter of the annular body 14A is kept constant irrespective of the actual pressure load in the contact surface with the deformation zone of the rod 12.

According to the embodiment shown in FIG. 8, the rigid rod may be composed of a number of bars 17 of a giant magneostrictive material, said bars being disposed edgeways adjacent each other, the ends of said bars being connected, e.g. articulately connected with an elongated, elastically bendable plane section 18, so that the dimensional change of the bars 17 in the longitudinal direction causes a bending of said section. Suitably, both flat sections 18 are in form engagement with a pair of rollers 7A, 7B, arranged in accordance with the embodiment illustrated in FIG. 5. In this embodiment it is possible to use the fact that the magnetostrictive rods have a larger dimensional change longitudinally than transversally. The bars 17 together with the sections 18 forms a composite body, which undergoes a dimensional change in the transverse direction under the influence of a magnetic field, i.e. crosswise with respect to the intended movement direction.

Possibly the bars 17 may be arranged in contact with each other and together forming said composite body. In this case, the sections 18 are deleted.

Even if the invention is described with reference to embodiments in which a first body is movable along a second body of magnetostrictive material, which is shaped as a straight, linear rod, the invention of course is equally applicable for rods extending in a circular shape, so that the body which is movable along said rod will describe a circular movement. Nor is the invention limited to the use of mgnetostrictive material of the kind undergoing a decrease of the transversal dimensions and an increase of the longitudinal dimensions under the influence of a magnetic field, but is equally applicable for use of magnetostrictive materials undergoing an increase of the transversal dimensions and a decrease of the longitudinal dimensions under the influence of a magnetic field. When using the invention it is thus possible to use magnetostrictive materials with positive magnetostriction or magnetostrictive materials having a negative magnetostriction. Instead of generating a wave through propagating along the rod, a bulge propagating along the rod wall be obtained, said bulge cooperating by form engagement with a movable body having a complementary shape.

According to a variant of an embodiment not shown, the body which is displacable along a rod is formed with a plurality of zones, disposed adjacent each other for simultaneous cooperation through form engagement with corresponding deformation zones of the rod, said deformation zones being generated due to magnetostrictive, electrostrictive or piezoelectrical action.

I claim:

1. Method of causing a first body (3, 7, 14), which is held in engagement with a second body (1, 8, 12), to move therealong, said second body comprising material which may be caused to undergo a dimensional change across the intended movement direction due to magnetostrictive, electrostrictive or piezoelectrical action, characterized in that said first body (3, 7, 14) is continuously held in cooperation through interlocking shape engagement with a zone (2, 10A, 10B, 15) of the second body, which is caused to undergo a dimensional change across the intended movement direction under the influence of a magnetic or electric field, said zone (2, 10A, 10B, 15) by displacement of said magnetic or electric field in the intended movement direction, being caused to move in said direction during simultaneous driving action by interlocking shape engagement on said first body (3, 7, 14) for coupled movement together with said zone (2, 10A, 10B, 15).

2. Method as claimed in claim 1, characterized in that said first body (7) is held in cooperation through form engagement with said zone (2, 10A, 10B) by rolling cooperation between said first body (7) and said zone.

3. Method as claimed in claim 1, characterized in that said first body (3, 14) is held in cooperation through form engagement with said zone (2, 15) by sliding cooperation via a lubricating film.

4. Method of causing a first body (3, 7, 14), which is held in engagement with a second body (1, 8, 12), to move therealong, said second body comprising material which may be caused to undergo a dimensional change across the intended movement direction due to magnetostrictive, electrostrictive or piezoelectrical action, characterized in that said first body (3, 7, 14) is continuously held in cooperation through form engagement with a zone (2, 10A, 10B, 15) of the second body, which is caused to undergo a dimensional change across the intended movement direction under the influence of a magnetic or electric field, said zone (1, 10A, 10B, 15) by displacement of said magnetic or electric field in the intended movement direction, being caused to move in said direction during simultaneous driving action by form engagement on said first body (3, 7, 14) for coupled movement together with said zone (2, 10A, 10B, 15); characterized further in that said first body (3, 14) is held in cooperation through form engagement with said zone (1, 15) by sliding cooperation via a lubricating film; characterized further in that a fluid forming said lubricating film during displacement of said zone (2, 15) along the second body (1, 12) is introduced continuously between the contact surfaces between the first body (3, 14) and said zone (2, 15).

5. Device for carrying out the method as claimed in claim 1, comprising a first body (3, 7, 14), which is held in engagement with a second body (1, 8, 12) of a material which may be caused to undergo a dimensional change across the intended movement direction due to magnetostrictive, electrostrictive or piezoelectrical action, characterized in that said first body (3, 7, 14), on the side thereof facing said second body, being shaped for obtaining cooperation through form engagement with a zone (2, 10A, 10B, 15) of the second body (1, 8, 12) which due to magnetostrictive, electrostrictive or piezoelectrical action has been caused to change its transversal dimensions.

6. Device for carrying out the method of causing a first body (3, 7, 14), which is held in engagement with a second body (1, 8, 12), to move therealong, said second body comprising material which may be caused to undergo a dimensional change across the intended movement direction due to magnetostrictive, electrocharacterized in that said first body (3, 7, 14) is continuously held in cooperation through form engagement with a zone (1, 10A, 10B, 15) of the second body, which is caused to undergo a dimensional change across the intended movement direction under the influence of a magnetic or electric field, said zone (2, 10A, 10B, 15) by displacement of said magnetic or electric field in the intended movement direction, being caused to move in said direction during simultaneous driving action by form engagement on said first body (3, 7, 14) for coupled movement together with said zone (2, 10A, 10B, 15); comprising a first body (3, 7, 14), which is held in engagement with a second body (1, 8, 12) of a material which may be caused to undergo a dimensional change across the intended movement direction due to magnetostrictive, electrostrictive or piezoelectric action, characterized in that said first body (3, 7, 14), on the side thereof facing said second body, being shaped for obtaining cooperation through form engagement with a zone (2, 10A, 10B, 15) of the second body (1, 8, 12) which due to magnetostrictive, electrostrictive or piezoelectrical action has been caused to change its transversal dimensions; characterized further in that said second body (1, 8) consists of a rod having two opposite parallel sides, said first body (7) comprising two rotatable rolls (7A, 7B) arranged on opposite sides of said rod, juxtaposed to each other, said rolls being connected with each other and being continuously held in contact with the opposite parallel sides of said rod in a zone of said rod (2, 10A, 10B) which has undergone a dimensional change in the transverse direction.

7. Device as claimed in claim 5, characterized in that the side of said first body (3, 14) which faces the second body (1, 12), has a shape which is substantially complementary of the form of the deformation zone (2, 15) of the other body (1, 12), with which said first body is in form engagement.

8. Device as claimed in claim 7, characterized in that said second body (1) consists of a rod (12) having a circular cross section, and said first body (3) consists of a ring (14) which is held in form engagement with said deformation zone (15) of said rod.

9. Device as claimed in claim 7, characterized in that said first body (1, 12) comprises means for continuously supplying lubricant to the interface between the zones of the bodies cooperating with each other through form engagement.

10. Device as claimed in claim 5, characterized in that said first body (3, 14) has a plurality of zones disposed adjacent each other for simultaneous cooperation through form engagement with corresponding deformation zones of said second body (1, 12), said deformation zones being generated due to magnetostrictive, electrostrictive or piezoelectrical action.

11. Method of causing a first body (3, 7, 14), which is held in engagement with a second body (1, 8, 12), to move therealong, said second body comprising material which may be caused to undergo a dimensional change across the intended movement direction due to magnetostrictive, electrostrictive or piezoelectrical action, characterized in that said first body (3, 7, 14) is continuously held in cooperation through form engagement with a zone (2, 10A, 10B, 15) of the second body, which is caused to undergo a dimensional change across the intended movement direction under the influence of a magnetic or electric field, wherein the disposition of the surface of engagement of the first body with the second body in said zone is non-parallel to said intended direction of movement so that a force applied by said dimensional change has a component in said intended direction of movement, said zone (2, 10A, 10B, 15) by displacement of said magnetic or electric field in the intended movement direction, being caused to move in said direction during simultaneous driving action by form engagement on said first body (3, 7, 14) for coupled movement together with said zone (2, 10A, 10B, 15).

12. Device for carrying out the method as claimed in claim 11, comprising a first body (3, 7, 14), which is held in engagement with a second body (1, 8, 12) of a material which may be caused to undergo a dimensional change across the intended movement direction due to magnetostrictive, electrostrictive or piezoelectrical action, characterized in that said first body (3, 7, 14), on the side thereof facing said second body, being shaped for obtaining cooperation through form engagement with a zone (2, 10A, 10B, 15) of the second body (1, 8, 12) which due to magnetostrictive, electrostrictive or piezoelectrical action has been caused to change its transversal dimensions, so that the disposition of the surface of engagement of the first body with the second body in said zone is non-parallel to said intended direction of movement so that a force applied by said dimensional change has a component in said intended direction of movement.

* * * * *